United States Patent
Teillet et al.

(10) Patent No.: US 8,489,041 B2
(45) Date of Patent: Jul. 16, 2013

(54) MULTI-ELEMENT AMPLITUDE AND PHASE COMPENSATED ANTENNA ARRAY WITH ADAPTIVE PRE-DISTORTION FOR WIRELESS NETWORK

(76) Inventors: Anthony Teillet, Trabuco Canyon, CA (US); Scott Carichner, Rancho Santa Margarita, CA (US); Alexander Rabinovich, Cypress, CA (US)

( * ) Notice: Subject to any disclaimer, the term of this patent is extended or adjusted under 35 U.S.C. 154(b) by 304 days.

(21) Appl. No.: 12/795,577

(22) Filed: Jun. 7, 2010

(65) Prior Publication Data

US 2010/0311353 A1 Dec. 9, 2010

Related U.S. Application Data

(60) Provisional application No. 61/185,137, filed on Jun. 8, 2009.

(51) Int. Cl.
 *H04B 1/04* (2006.01)
 *H03F 1/32* (2006.01)
(52) U.S. Cl.
 CPC ........... *H03F 1/3247* (2013.01); *H04B 1/0475* (2013.01)
 USPC ...................... 455/114.3; 455/115.3; 455/126
(58) Field of Classification Search
 USPC ................ 455/114.3, 115.1, 115.3, 120, 121, 455/123, 125, 126, 127.1, 127.2, 127.3, 101, 455/272; 342/361, 368
 See application file for complete search history.

(56) References Cited

U.S. PATENT DOCUMENTS

| | | | | |
|---|---|---|---|---|
| 5,675,285 A | * | 10/1997 | Winters | 330/124 R |
| 6,157,343 A | * | 12/2000 | Andersson et al. | 342/371 |
| 6,859,643 B1 | * | 2/2005 | Ma et al. | 455/101 |
| 6,989,795 B2 | | 1/2006 | Edward et al. | |
| 7,280,848 B2 | * | 10/2007 | Hoppenstein | 455/561 |
| 7,496,384 B2 | * | 2/2009 | Seto et al. | 455/562.1 |
| 7,869,828 B2 | * | 1/2011 | Wang et al. | 455/561 |
| 2002/0071482 A1 | * | 6/2002 | Peters et al. | 375/222 |
| 2006/0009162 A1 | | 1/2006 | Tan et al. | |
| 2007/0194986 A1 | | 8/2007 | Dulmovits, Jr. et al. | |

OTHER PUBLICATIONS

R.C. Johnson, "Antenna Engineers Handbook," 3$^{rd}$ Edition, McGraw Hill, ISBN 0-07-032381-X, Ch 20, Figure 20-2, 1993 McGraw-Hill.
International Search Report and Written Opinion pertaining to International Application No. PCT/US2010/037657 dated Aug. 6, 2010.

* cited by examiner

*Primary Examiner* — Duc M Nguyen
(74) *Attorney, Agent, or Firm* — OC Patent Law Group; David L. Henty

(57) ABSTRACT

An improved communication system and method employing an actively controlled antenna array architecture is disclosed. The array contains a plurality of driven radiating elements that are spatially arranged having a pair of radiating elements fed with an RF signal predistorted so as to provide a controlled variation of the antenna array's elevation radiation pattern. High power amplifier (PA) efficiency is maintained by adaptive predistortion, coupled to each high power PA, while providing beam tilt and side lobe control.

21 Claims, 12 Drawing Sheets

MULTI-ELEMENT AMPLITUDE AND PHASE COMPENSATED ANTENNA ARRAY WITH ADAPTIVE PRE-DISTORTION FOR WIRELESS NETWORK

RELATED APPLICATION INFORMATION

The present application claims priority under 35 U.S.C. Section 119(e) to U.S. Provisional Patent Application Ser. No. 61/185,137 filed Jun. 8, 2009, the disclosure of which is incorporated herein by reference in its entirety.

BACKGROUND OF THE INVENTION

1. Field of the Invention

The present invention relates in general to communication systems and components, and related methods. More particularly, the present invention is directed to actively controlled antenna arrays and methods of actively controlling the elevation radiation pattern of an antenna array.

2. Description of the Prior Art and Related Background Information

Modern wireless antenna array implementations generally include a plurality of radiating elements that may be arranged over a reflector plane defining a radiated (and received) signal beamwidth and elevation plane angle (also known as tilt angle). The elevation plane angle antenna beamwidth can be advantageously modified by varying amplitude and phase of an RF signal applied to respective radiating elements. The elevation plane angle antenna beamwidth has been conventionally defined by Half Power Beam Width (HPBW) of the elevation plane angle of the beam relative to a bore sight of such antenna array. In such antenna array structure, the radiating element positioning is critical to the overall beamwidth control as such antenna systems rely on accuracy of the amplitude and phase angle of the RF signal supplied to each radiating element. This requires significant restrictions of the tolerance and the accuracy of a mechanical phase shifter to provide required signal division between various radiating elements over various elevation plane angle settings.

Real world applications such as terrestrial telephony often call for a high gain antenna array with beam down tilt and/or azimuth beamwidth controls that may incorporate a plurality of mechanical phase shifters to achieve such functionality. High gain, multi element antenna arrays are well known in the art (phased array antennas) and generally incorporate a linear phased array with equal or unequally spaced radiating elements. By controlling the phase and amplitude of excitation to each radiating element, the radiation beam direction and the shape of the beam radiated by the array can be dynamically controlled.

Such highly functional antenna arrays are typically retrofitted in place of simpler, lighter, and less functional antenna arrays. Hence, the weight and wind loading of the newly installed antenna array cannot increase significantly. Phase and amplitude accuracy of a mechanical phase shifter generally depend on its construction materials. Generally, highly accurate mechanical phase shifter implementations require substantial amounts of relatively expensive dielectric materials and rigid mechanical support. Such construction techniques result in an increased assembly volume, weight, and manufacturing costs. Additionally, mechanical phase shifter configurations that have been developed utilizing lower cost materials may fail to provide adequate passive intermodulation suppression under high power RF signal levels. Consequently, due to these design limitations, unwanted upper side lobe suppression at different down tilt angles may occur.

Additional constraints related to upper side lobe suppression requires precise amplitude signal division for each radiating element used in such an antenna array which, in turn, may require variable amplitude signal division in addition to phase shift as provided by such phase shifter. Adding controlled amplitude variation to a high power phase shifter is problematic and further complicates its implementation.

Terrestrial telephony, such as cellular radio networks, extensively use antenna array antennas to attain enhanced geographical coverage which requires that the desired radiation pattern is known beforehand. A radiation pattern of a typical multi element radiation array may have a main lobe and numerous side-lobes. The center of the main lobe is defined as being equidistant between the two −3 dB roll off points is the antenna's direction for maximum gain.

Based on network coverage requirements, cellular radio network operators often have to adjust the vertical radiation pattern of the antennas, i.e. the pattern's cross-section in the vertical plane. When required, alteration of the vertical angle of the antenna's main beam, also known as the "tilt", is used to adjust the coverage area of the antenna. Antenna angle of tilt have been implemented both mechanically and electrically, either individually or in combination utilizing remote control capabilities.

Antenna beam tilt angle may be adjusted mechanically by moving antenna elements relative to the vertical axis which is commonly referred to as a "mechanical tilt". As described above, antenna beam tilt angle may be adjusted electrically by changing phase of signals fed to or received from each radiating element of the antenna array without moving antenna structure which is referred to as "electrical tilt". When used in a cellular network, an antenna array vertical radiation pattern has to meet several key parameters. First, the antenna must provide high boresight gain over a useful beam width angle. Second, the antenna must exhibit first and second upper side lobe levels suppression. And finally, the antenna must suppress side lobe levels below a set limit over full range of beam down tilt angles.

The aforementioned requirements are mutually conflicting. For example, increasing the boresight gain may increase side lobes as well as side lobe angles and levels over various down tilt angles. It has been established that, if first and second upper side lobe levels are less than −15 dB, a workable compromise for the overall antenna performance can be achieved.

Generating a required angle of electrical tilt from a shared antenna has thus far resulted in compromises in the performance of the antenna. For example, the boresight gain decreases in proportion to the cosine of the angle of tilt due to a reduction in the effective aperture of the antenna. This effect is unavoidable and happens in all antenna designs. Further reductions in boresight gain may result as a consequence of the method used to change the angle of tilt.

In a conventional cellular network deployment Base Station (BS), an electrical tilt equipped antenna is coupled via a cable run to a suitable multi carrier transmitter. Typically, multi carrier transmitters may employ individual single carrier High Power amplifiers (PAs) for amplifying individual carrier signals produced by transceivers. RF outputs from the single carrier high power amplifiers are combined using high isolation cavity combiners, passed through receive—transmit duplexers before being coupled to a tower cable run (or RF wave guide) coupled to a tower mounted antenna. Such configuration is highly inefficient as individual RF amplifier outputs are attenuated due to losses associated with cavity combiners, duplexers, and the tower cable run connecting amplifier output to the an antenna.

An improved BS may employ multi carrier amplifiers which amplify individual RF carriers within a single amplifier. Such multi carrier power amplifiers (MCPA) utilize linearization schemes, which are well known in the art, to provide RF output that has reduced intermodulation distortion (IMD) and noise signal levels due to amplification nonlinearities present in the MCPA. However, tower cable run losses and duplexer losses are still present and must be accounted. To further reduce insertion losses present in tower cable run and duplexers, the BS equipment must be mounted as close as possible to antenna. To achieve this, a Remote Radio Head (RRH) is mounted in the immediate proximity of the antenna. A RRH typically employs a linearized PA transmitter to provide RF carrier signals, while suppressing intermodulation and noise signal levels due to amplification produced within PA section of the RRH. Numerous linearization schemes known in the art can be employed in RRH transmitter PA section to provide appropriate IMD and noise level suppression. In all aforementioned operational deployments, the combined transmitter RF output from a common antenna port must have IMD and noise levels suppression as dictated by appropriate regulatory limits. In general, higher combined output levels require increased IMD and noise levels suppression since some of these limits have absolute power levels that can not be exceeded.

Placing a high power PA in close proximity to an antenna introduces a host of technical challenges related to PA linearity and efficiency as determined by PA's operating range on a characteristic Amplitude to Amplitude Modulation (AM-AM) and Amplitude Modulation to Phase Modulation (AM-PM) curves. Modern cellular systems employ complex, digitally modulated RF signals which tend to require highly linear PA operation. Maintaining desired output signal linearity while providing efficient operation is a highly desired characteristic for a PA. PA power efficiency can be calculated by dividing total power delivered to a load by the total power supplied to the amplifier. Depending on the bias class of the amplifier, output stage efficiency can be as low as 7-10 percent for class A amplifiers to as high as 45 percent for Doherty class amplifiers. Unfortunately, there is performance tradeoff between linearity and efficiency in PAs as highly linear operating class PAs (Class A for example) tend to be least power efficient when compared to similarly capable Class AB. Additionally, highly efficient amplifiers are required for tower mounted operation since conventional forced air cooling techniques add bulk and reduce reliability (as fans tend to fail when exposed to elements). In previous attempts, keeping a PA operating in high efficiency operation was found difficult to achieve due to dynamic nature of amplified signals, further being complicated by the antenna beam tilting.

R. C. Johnson, Antenna Engineers Handbook, 3rd Ed 1993, McGraw Hill, ISBN 0-07-032381-X, Ch 20, FIG. 20-2 teaches a well known method for adjusting a phased array antenna's electrical down tilt angle. A suitable radio frequency (RF) carrier signal is fed to input port of antenna array from a transmitter and divided among the antenna's radiating elements. Each radiating element is fed from a respective variable phase shifter so that signal phase can be precisely adjusted to vary the antenna array electrical down tilt. As noted previously, the division of power to antenna radiating elements must be controlled so as to provide satisfactory side lobe levels for a given boresight gain. It is highly desirable to maintain phase front for all downtilt angles so that the side lobe levels are not increased above set limits. However, this has been very difficult to achieve since practical phase shifters exhibit insertion loss variation over the range phase shift settings thus introducing RF signal division inaccuracies— contributing to the increased side lobe levels. Consequently, there is a need to provide a simpler method to adjust antenna down tilt beam, while providing enhanced upper side lobe suppression.

SUMMARY OF THE INVENTION

It is an object of the present invention to provide a variable beam tilt adjustable antenna employing adaptive predistortion with high efficiency power amplifier modules to achieve linear signal amplification and beam forming.

In carrying out these and other objectives, features, and advantages of the present invention, a variable beam tilt, RF power amplifier enabled, antenna array is provided for a wireless network system.

In the first aspect, the present invention provides a predistortion compensated transmitter and antenna system. An input receives a digital input communication signal. A digital radio receives the digital input communication signal and provides an RF signal. A first predistorter receives the RF signal and performs a first predistortion operation on the RF signal and provides a first predistorted RF signal. A first amplifier receives and amplifies the first predistorted RF signal and provides a first amplified RF signal. A first radiating element is electrically coupled to receive the first amplified RF signal. A second predistorter receives the RF signal and performs a second predistortion operation on the RF signal and provides a second predistorted RF signal. A second amplifier receives and amplifies the second predistorted RF signal and provides a second amplified RF signal. A second radiating element is electrically coupled to receive the second amplified RF signal. The digital radio, the first and second predistorter, the first and second amplifier, and the first and second radiating element are configured at an antenna radiating location in close proximity with each other.

In a preferred embodiment of the present invention, the first and second predistorter each performs an analog amplitude and phase predistortion on the RF signal. The first and second amplifier each comprise a power amplifier biased for operation in a high efficiency mode. A first adaptive controller provides first amplitude and phase control signals to the first predistorter and a second adaptive controller provides second amplitude and phase control signals to the second predistorter. The first and second radiating element each comprise two cross polarized radiating elements. The first and second amplifiers are passively cooled.

In another aspect, the present invention provides a predistortion compensated transmitter and antenna system having beam forming capability. An input receives an input signal. An amplitude and phase adjusting network provides a first amplitude and phase beam forming control signal and a second amplitude and phase beam forming control signal. A first adaptive predistortion module receives the input signal and the first amplitude and phase beam forming control signal, performs a predistortion operation on the input signal, and provides a first predistorted input signal. A first amplifier amplifies the first predistorted input signal and provides a first amplified signal as a first output, where the first adaptive predistortion module is in close proximity with the first amplifier. A first radiating element is electrically coupled to the first output. A second adaptive predistortion module receives the input signal and the second amplitude and phase beam forming control signal, performs a predistortion operation on the input signal and provides a second predistorted input signal. A second amplifier amplifies the second predistorted input signal and provides a second amplified signal as a second output, where the second adaptive predistortion module is in close proximity with the second amplifier. A second radiating element is electrically coupled to the second output.

In a preferred embodiment of the present invention, the input signal is an analog RF modulated signal and the first adaptive predistortion module performs a first analog amplitude and phase predistortion on the input signal and the second predistortion module performs a second analog amplitude and phase predistortion on the input signal. The first adaptive predistortion module, the first amplifier, the first radiating element, the second predistortion module, the second amplifier, and the second radiating element are passively cooled. The first amplitude and phase beam forming control signal is independent of the second amplitude and phase beam forming control signal.

In another aspect, the present invention provides a method for adaptively providing an antenna beam of a transmitter and antenna system having a plurality of beam forming modes. An RF input signal is received. A control signal corresponding to a first beam forming mode is received. A first radiating element expected signal strength for the RF signal for the first beam forming mode is determined. The RF input signal is distorted based on the first radiating element expected signal strength to form a first predistorted signal. The first predistorted signal is amplified to form a first output signal. The first output signal is electrically coupled to a first radiating element. A second radiating element expected signal strength for the RF signal for the first beam forming mode is determined. The RF input signal is distorted based on the second radiating element expected signal strength to form a second predistorted signal. The second predistorted signal is amplified to form a second output signal. The second output signal is electrically coupled to a second radiating element. A first beam pattern is generated from the radiated emissions from the first and second radiating elements.

In a preferred embodiment, a digital input signal is received from a remote base station location and is converted to RF to provide the RF input signal at the location of the transmitter and antenna system. The amplification of the first and second predistorted signal to form the first and second output signals further comprises controlling a first and second amplifier for operation in a high efficiency mode. A control signal corresponding to a second beam forming mode is received. The first and second radiating element expected signal strengths for the RF signal for the second beam forming mode is determined. Different first and second predistortion operations are performed based on the first and second radiating element expected signal strengths for the RF signal for the second beam forming mode. The first and second amplifying are controlled by adjusting a first and second amplifier bias based on the first and second radiating element expected signal strengths for the RF signal for the second beam forming mode. The relative phase value and relative amplitude value for the first beam forming mode is determined. The first and second radiating element expected signal strength for the RF signal for the first beam forming mode is determined by employing the relative phase value and relative amplitude value for the first beam forming mode. The relative phase value and relative amplitude value is determined by determining the relative phase value and relative amplitude value that tilts the first beam pattern to a predetermined direction. The relative phase value and relative amplitude is determined by determining the relative phase value and relative amplitude value that minimizes the upper side lobe of the first beam pattern. The relative phase value and relative amplitude is determined by determining the relative phase value and relative amplitude value that maximizes the gain of the main emission lobe of the first beam pattern. The relative phase value and relative amplitude is determined by determining the relative phase value and relative amplitude value that provides inter lobe null filling of the first beam pattern.

The foregoing is a brief non-limiting summary of objects and aspects of the invention. Further features and advantages of the present invention will be appreciated from the following detailed description of the invention.

DETAILED DESCRIPTION OF THE INVENTION

Reference will be made to the accompanying drawings, which assist in illustrating the various pertinent features of the present invention. Due to multi positioning and use of identical elements in the parallel paths these labels may be referred to without the suffix a or b, since suffix indicates either of the relevant pair of elements is being referred to without distinction. The present invention will now be described primarily in solving aforementioned problems relating to use of predistortion compensated dual elements. It should be expressly understood that the present invention may be applicable in other applications wherein tilt angle and or beamwidth control is required or desired. In this regard, the following description of a predistortion compensated dual polarized antenna array is presented for purposes of illustration and description. Furthermore, the description is not intended to limit the invention to the form disclosed herein. Accordingly, variants and modifications consistent with the following teachings, and skill and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention. The present antenna is suitable for receiving and transmission of Radio Frequency (RF) signals as it shall be understood that signal flow is complementary and bidirectional unless pointed out otherwise.

One or more embodiments of the present invention employs predistortion modules and power amplifiers positioned in a near proximity to commonly fed radiating elements. An array of PA-antenna modules combine to form a beam forming antenna array. Linearization requirements for each PA are reduced due to lower operating power of each PA. The shape of the radiation emission may be tailored by varying the incident RF amplitude and phase applied to each radiating module. The use of predistortion modules reduces PA power consumption by employing higher-efficiency PAs while maintaining IMD and spurious levels within mandated specifications. Each predistortion module can be independently set to vary phase and amplitude of resultant correction signal used for linearization of amplified signal. This results in lower beam forming summation of IMDs from all radiating modules because any noise introduced within each independent predistortion module will have a random phase which will not constructively interfere in the resulting wavefront. Teachings related to predistortion modules previously disclosed in U.S. Pat. No. 7,288,988 (Braithwaite) may be employed herein and the disclosure of such patent is incorporated herein by reference.

Figure 4:
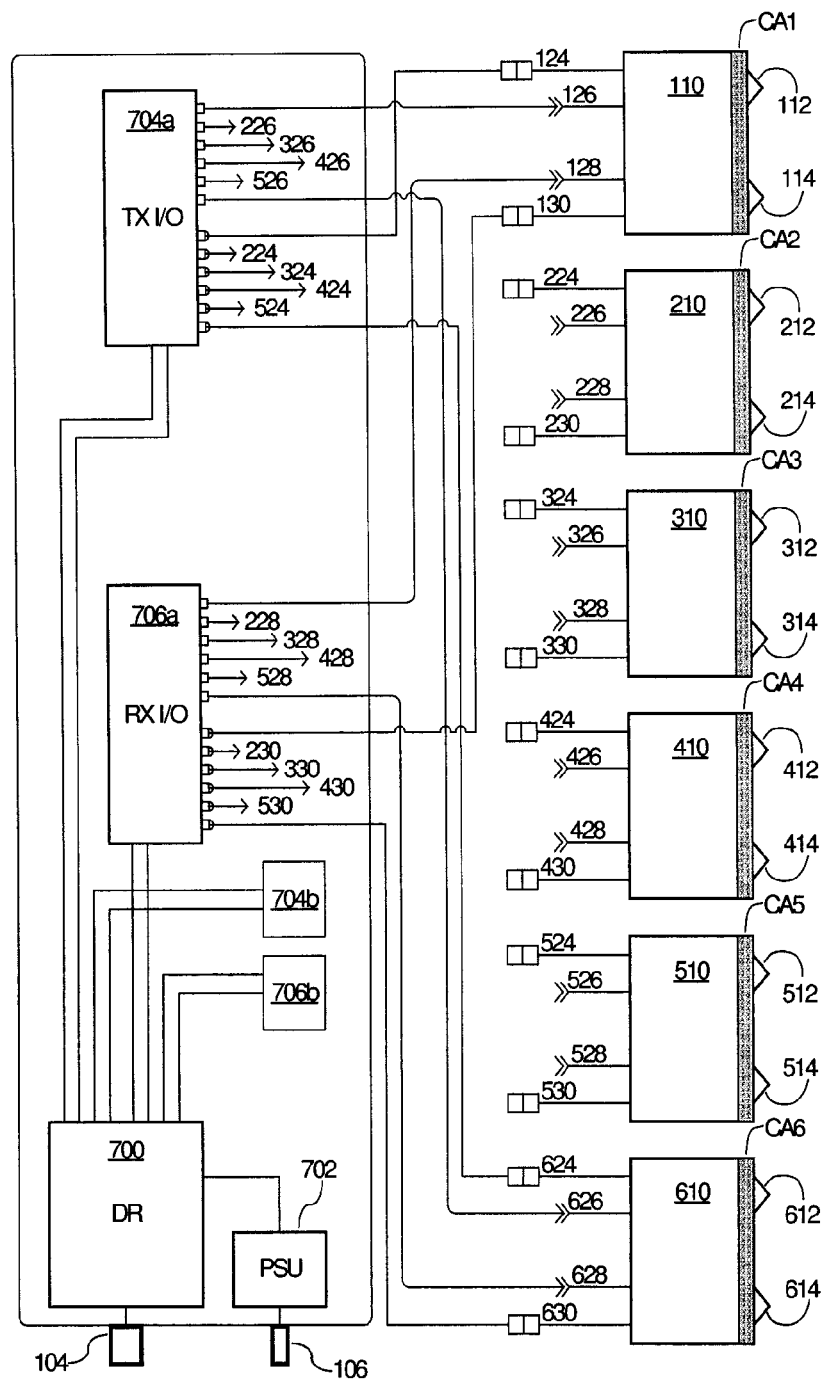
FIG. 4 is a diagram for a predistortion compensated antenna array in accordance with a preferred embodiment of the present invention.
Figure 8:
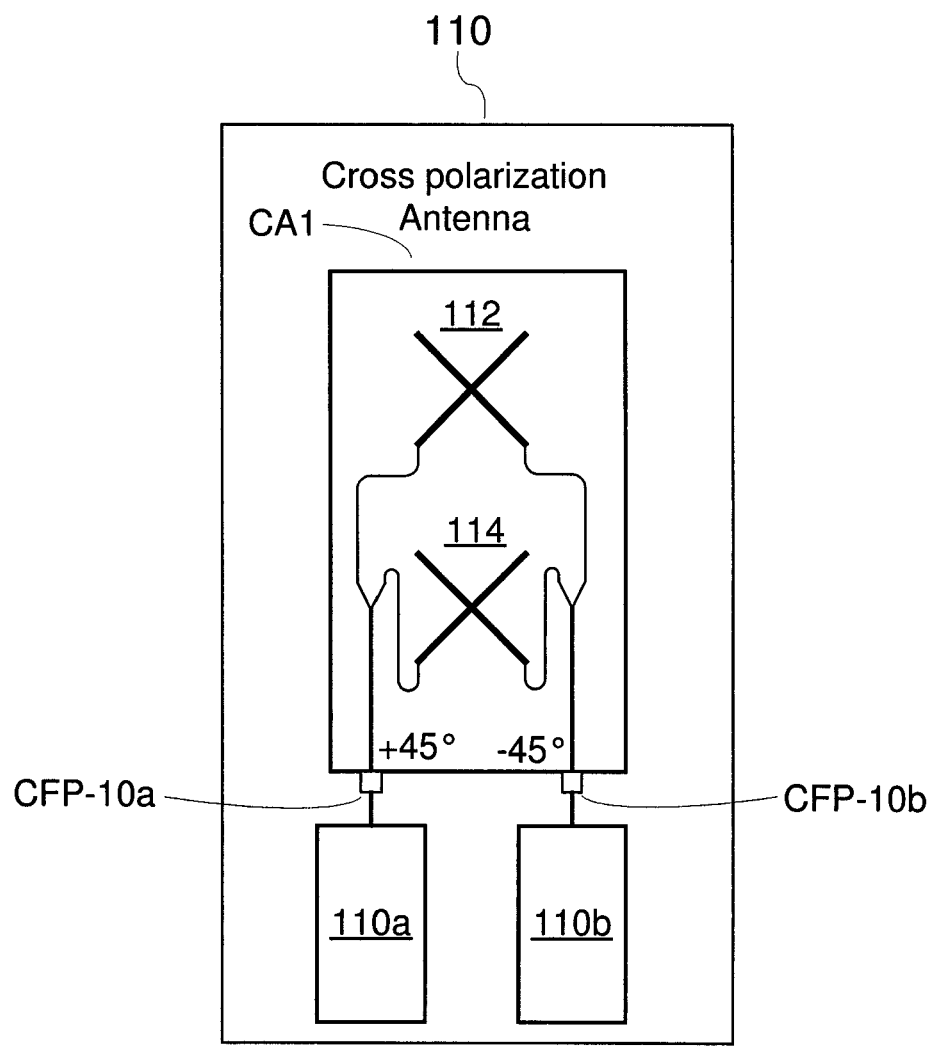
FIG. 8 presents a top level RF diagram for a dual element radiation module in accordance with a preferred embodiment of the present invention.
Figure 9:
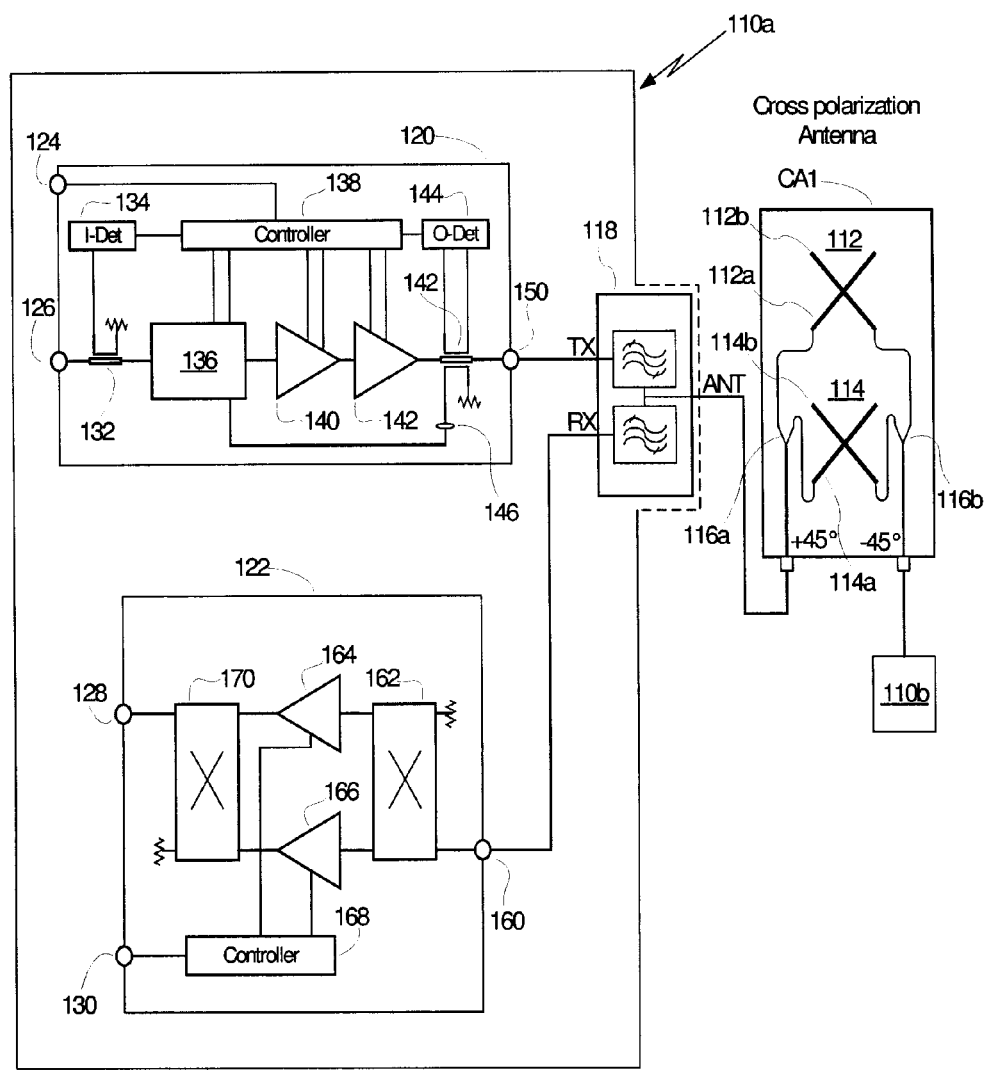
FIG. 9 presents a diagram of a cross polarized antenna array in accordance with a preferred embodiment of the present invention.

As depicted in FIG. 4, in a first preferred embodiment, six pairs of identical radiating cross polarized radiating elements (112, 114), (212, 214), (312, 314), (412, 414), 512, 514), (612, 614) are arranged in common pair groups CA1, CA2, CA3, CA4, CA5, CA6 respectively. The employment of six pairs is not a limiting factor as any number of pairs can be used. With reference to FIGS. 8 and 9, a first common pair group (CA1) comprises a first cross polarized (112) radiating element and a second cross polarized radiating element (114). Each section of the cross polarization radiating element (112a, 114a or 112b, 114b) of the radiating elements (112, 114) are coupled to a fixed ratio two port dividing network (116a or 116b) with common port (CFP-10a CFP10b). Conventionally one port is assigned +45 deg polarization (CFP-10a) and second port −45 deg polarization (CFP-10b). The two half's are identical in all other respects and reference herein under will be made to +45 deg polarization, but the same operational concepts apply equally to −45 deg polarization.

A duplexer 118 (ANT port) is operatively coupled to a common port CFP-10a to facilitate simultaneous transmit and receive functionality. In the TX path, a predistortion controlled power amplifier module 120 is provided in the immediate proximity to the duplexer 118 with its output 150 coupled to the TX port of said duplexer 118. As depicted in FIG. 9, in the receive path, a low noise amplifier (LNA) 122 is provided having its input port 160 coupled to the RX port of said duplexer 118. Duplexer filter 118 provides suitable RF signal filtering for receive and transmit path to provide concurrent operation and isolation for downlink and uplink RF signals. The LNA 122 is provided in the active antenna array 10 to improve the receiver noise figure and sensitivity. LNA output signal is coupled to LNA output port 128. LNA 122 is provided with a management controller 168. In one or more embodiments of the invention, LNA 122 comprises coupler 162, amplifiers 164 and 166, coupler 170, and controller 168.

Figure 5:
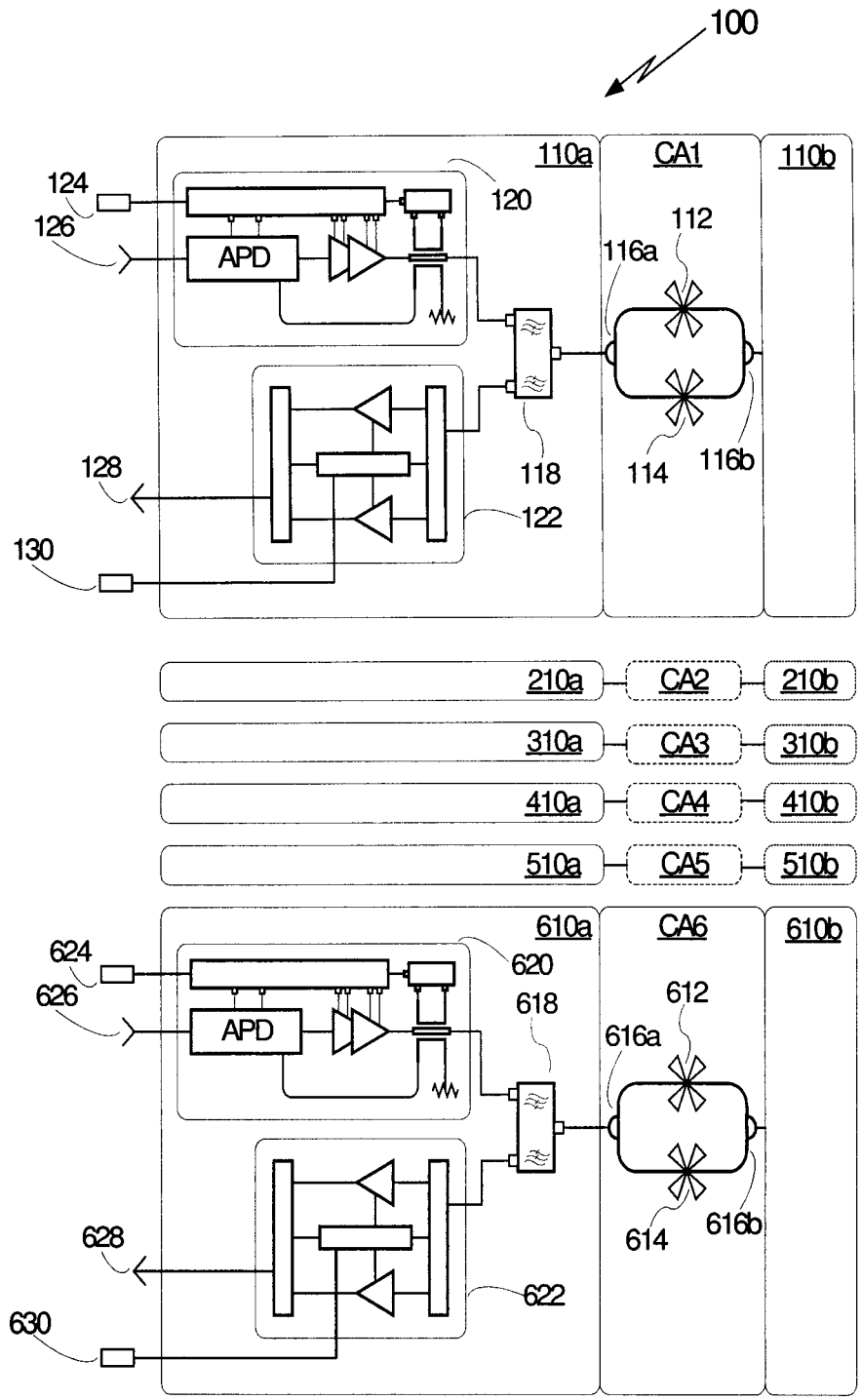
FIG. 5 presents a diagram of a radiating dual element, predistortion controlled radiating module in accordance with a preferred embodiment of the present invention.

As depicted in FIG. 9, a predistortion controlled power amplifier module 120 provides downlink RF signal amplification. An input RF port 126 is coupled to a first directional coupler 132 which samples input RF signal coupled to input port 126. First directional coupler 132 provides sampled input signal to input detection module 134. Input detection module 134 provides phase and amplitude information to Controller module 138. An adaptive predistortion module 136 input port is operatively coupled to the first directional coupler 132 output port. Predistortion module 136 is responsive to control signals from Controller Module 138, and observation RF sample signal 146 from the output directional coupler 142 to provide corresponding predistortion signal to amplification stage (140, 142), to produce linearized amplified RF signal 150. Output RF signal is sampled by output coupler 142 providing sampled RF signal to the output detector 144 module. Output detector 144 module provides both forward and reverse signals levels to controller 138 and forward phase information. Controller module 138 provides control signals to aforementioned adaptive predistortion module 136 and amplification gain stages (140, 142) while monitoring observation input signals. Controller module 138 communicates operational parameters via digital interface 124 to intelligent phase and amplitude dividing TX I/O network 704a. A complimentary RX I/O network 706a is provided for uplink signals amplified by LNA module 128. FIG. 5 illustrates that each of the predistortion controlled power amplifier modules 210a, 310a, 410a, 510a, and 610a comprise similarly configured circuitry as predistortion power amplifier module 110 and are coupled to active modules CA1, CA2, CA3, CA4, CA5, and CA6. Predistortion power amplifier module 610 comprises an input RF port 626, digital interface 624 and duplexer 618. Active module CA6 comprises dividing network 616a and 616b, and radiating elements 612 and 614, FIG. 4 presents an active antenna array 10 (AAA) interconnection diagram. AAA is provided with high speed interface 104 which is coupled to Digital Radio (DR) module 700. DR Module 700 provides digital to RF conversion along with supervisory functions used for control and monitoring. A Power supply unit (PSU) 702 is coupled to power port 106. DR 700 provides RF signals for transmission in the downlink (DL) direction (i.e. from AAA 10 to Mobile Users (MU)) and in uplink (UL) direction (i.e. from MU to AAA). DL link RF signals provided by DR 700 are coupled to intelligent phase and amplitude (IPA) dividing TX I/O network 704a along with beam forming requirement Mode data (P1, P2, P3 ... Pn) on a separate control line. TX I/O network interfaces with active modules 110, 210, 310, 410, 510, and 610 through RF ports 126, 226, 326, 426, 526, and 626 and interfaces 124, 224, 324, 424, 524, and 624 respectively.

Figure 3:
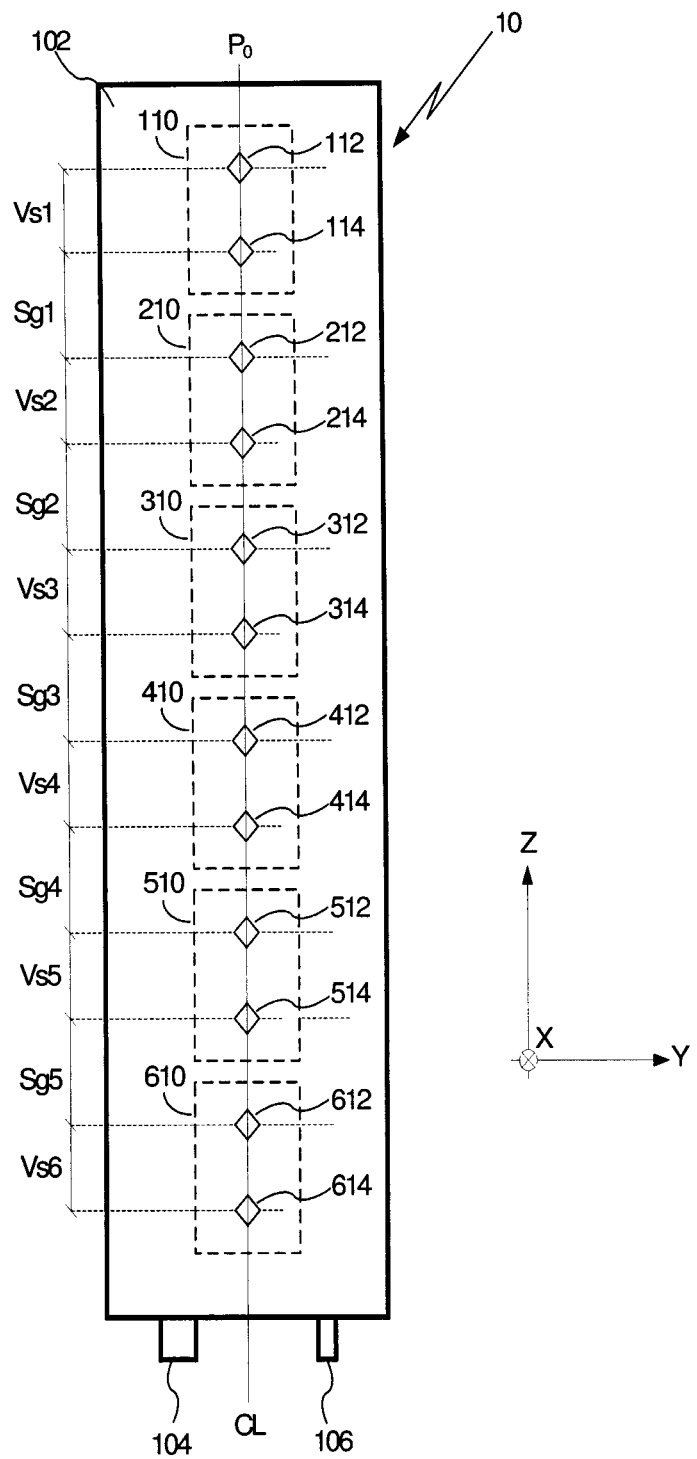
FIG. 3 is a front view of a cross-polarized predistortion compensated antenna multi element array in accordance with a preferred embodiment of the present invention.

FIG. 3 presents a schematic diagram of a front view for an active antenna array (AAA) 10. In a preferred embodiment, such AAA 10 is constructed utilizing a rectangular shaped reflector 102 providing a suitable reflector plane for six dual element active modules 110, 210, 310 410, 510, 610. The number of active modules 110, 210, 310 410, 510, 610 is selected depending on design criteria, which includes aforementioned design requirements and tradeoffs. Each active module 110-610 further utilizes a pair of cross polarized radiating elements 112, 114, 212, 214, 312, 314, 412, 414, 512, 514, 612, 614 that are generally arranged longitudinally along reflector 102 center axis P0. Common Active Module (CAM) may have individually spaced radiating elements such that element spacing maybe unequal, however in its basic form radiating element spacings Vs1, Vs2, Vs3, Vs4, Vs5, Vs6 are identical. Similarly, adjacent active module spacings Sg1, Sg2, Sg3, Sg4, Sg5 can be unequal, but in exemplary embodiment, spacing Sg dimensions can be equidistant and equal to inter element Vs spacing dimensions. A suitable high speed interface 104 is provided which is used to channel digitized RF signals to and from AAA 10 along with supervisory control signals which are used to control and monitor AAA 10 operation. A power connector 106 is provided to deliver required power to AAA 10 circuits.

Figure 1A:
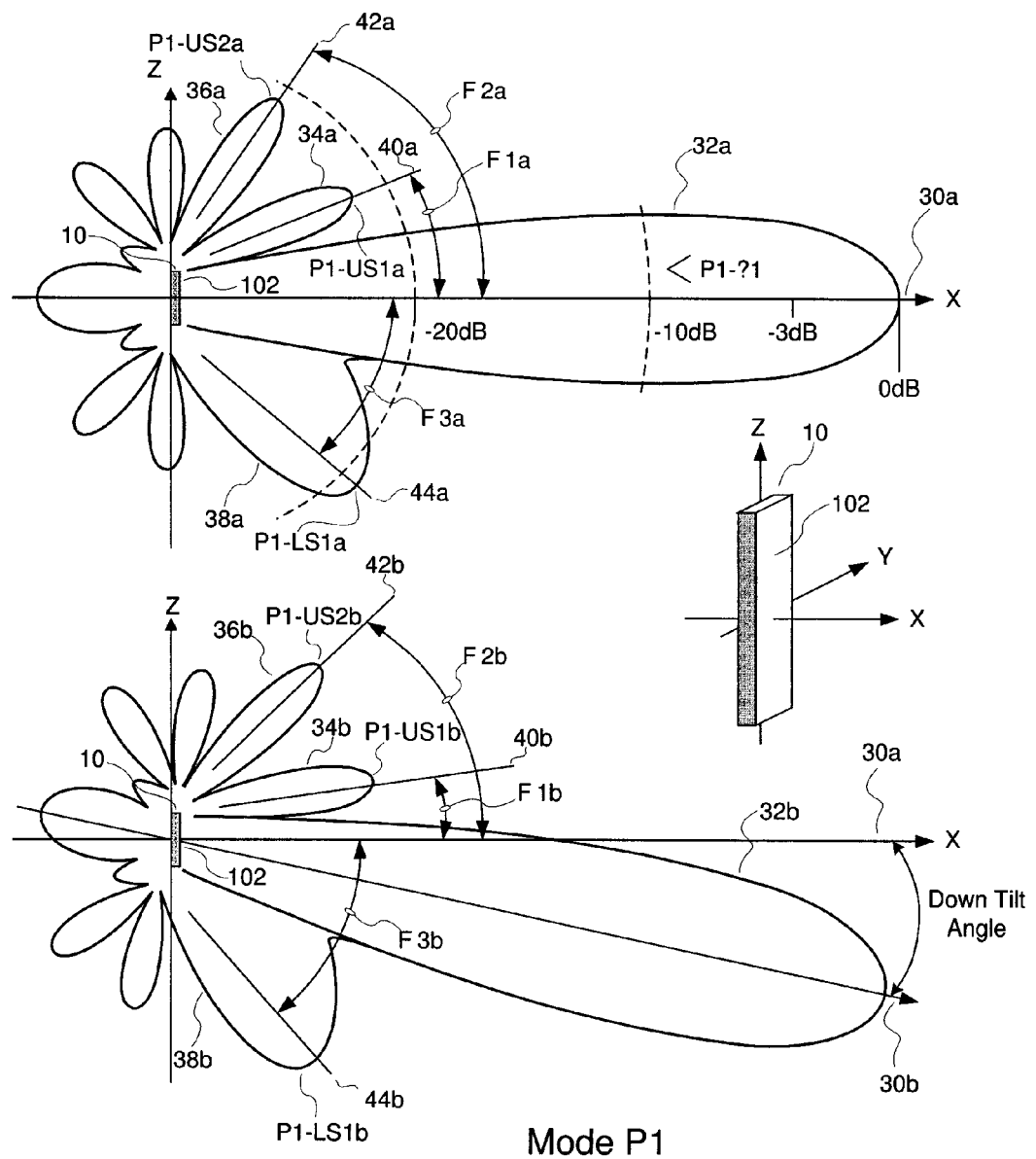
FIG. 1A is a representation of simulated vertical antenna radiation patterns of a vertically positioned antenna array having an electrical down tilt capability set at 0 and maximum down tilt angles with optimized $1^{st}$ upper side lobe (P1-US1) suppression.

FIG. 1A presents two vertical radiation patterns 32a and 32b of AAA 10 having rectangular planar reflector 102 positioned outwards along X-axis which are provided to illustrate the radiation beam tilting concept. AAA 10 utilizes a planar reflector 102 and its geometric center has been defined along its vertical axis (Z-axis) running along the back side of reflector 102 plate. The two vertical radiation patterns 32a and 32b of AAA 10 correspond to zero and maximum phase shift settings applied to individual radiating element signals. When signal phase shift is set to a minimum (zero), the main lobe 32a centered about center line or "boresight" 30a which corresponds to X-axis of the antenna 10. In addition to the main radiation beam 32 pattern, first upper sidelobe (USL) 34, second USL 36, and upper and first lower sidelobes 38 are identified to indicate their relative direction (30, 40 at angle φ1 relative to the x axis, 42 at angle φ2 relative to the x avis, 44 at angle φ3 relative to the x axis) and amplitude relative US1, US2, LS1 to boresight 30 direction for the main beam 32. The maximum downward tilted radiation beam 32b with its boresight axis 30b are illustrated and compared to minimum tilt radiation beam 32a with its boresight axis 30a.

When an antenna is used in a cellular network, several key parameters must be met. First, the antenna must provide high boresight gain over a useful beam width angle. Second, the antenna must suppress first USL 34 and second USL 36 to avoid harmful interference to Mobile Users (MU) in the neighboring cell sites. And third, the relative amplitude US1, US2 and departure angle φ1, φ2 of the USLs 34 and 36 should remain within set limits when the antenna is electrically tilted over tilt angle range. In practical antenna implementations, attaining these requirements is difficult because, for example, maximizing boresight gain will increase amplitude of sidelobes 34, 36, and 38. Effective control of sidelobes may require minor reduction in boresight gain which tends to decrease proportionally to the cosine of the main beam tilt angle resulting from reduction of the antenna's effective aperture. Further reductions in boresight gain may be needed depending on the range of down tilt angle.

Figure 1B:
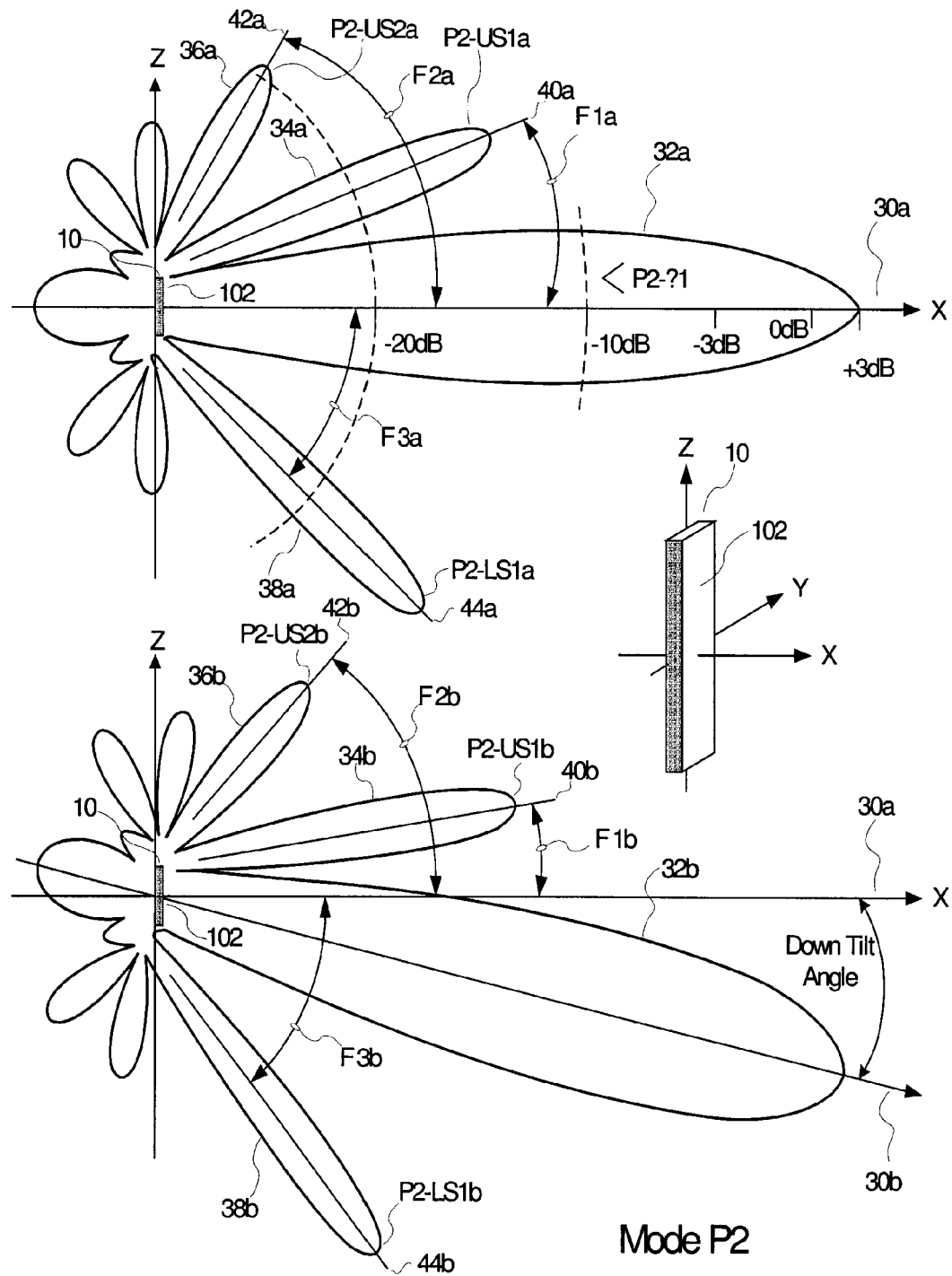
FIG. 1B is a representation of simulated vertical radiation patterns of a vertically positioned antenna array having an electrical down tilt capability set at 0 and maximum down tilt angles optimized for maximum forward gain.
Figure 1C:
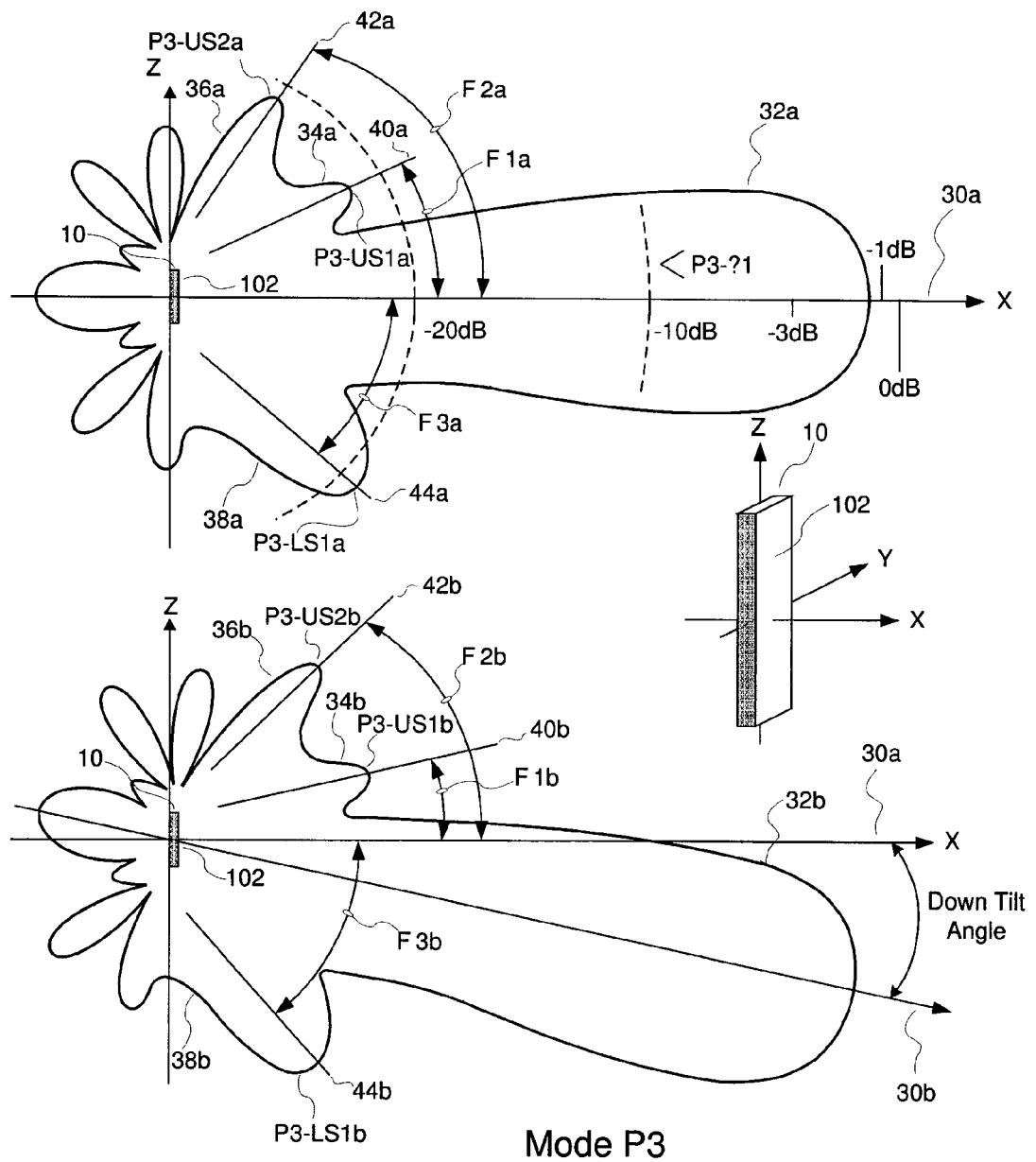
FIG. 1C is a representation of simulated vertical radiation patterns of a vertically positioned antenna array having an electrical down tilt capability set at 0 and maximum down tilt angles optimized for $1^{st}$ upper side lobe (P1-US1) and null fill.

FIGS. 1A, 1B, and 1C depict various vertical beam shaping modes (P1, P2, P3) offered by one or more embodiments of the present invention. Additional vertical beam shaping modes are possible. For example, consider first USL 34a (i.e., P1-US1a) when set to 0 degree down tilt. In mode P1, first USL 34a is substantially reduced (<20 dB) relative to the main radiation lobe 32a. When the antenna is commanded to maximum down tilt, radiating energy from the antenna does not present interfering signals due to first USL 34b in nearby sectors. In other operational instances, high forward gain might be required (Mode P2). When configured in Mode P2 as depicted in FIG. 1B, the first USL 34a (i.e., P2-US1a) suppression typically is degraded when compared to P1 mode. P2 mode may prove to be offensive in nearby sectors when tilted as down tilted first USL P2-US1b signal levels may be excessive. Mode P2 also exhibits in slightly narrower vertical half power beamwidth angle (HPB) P2-θ1. Mode P2 is primarily intended for communications with infrequent distant users, or in emergency operation which may require extended distance sector coverage not otherwise required. As depicted in FIG. 1C, Mode P3 is designed to provide nearly uniform coverage in close proximity to the cell cite. Mode P3 provides inter lobe null filling which reduces near cell cite signal variation regardless of the tilt angle (θ1a-θb), insomuch as first lower side lobe P3-LS1a is 'blended' with main beam 30a so that vertical beam tilting does not introduce excessive signal variation to mobile users (MU) in near proximity to the cell cite. Mode P3 is especially useful when providing coverage for crowded venues such as concerts or sporting events where a large number of MU's located in near proximity to the cell cite. Mode P3 also provides slightly wider (HPB) P3-θ1 as well as adequate first USL P3-US1a for all tilt angles. Additional radiation patterns and modes can be easily devised and implemented with the present antenna without altering antenna construction.

Figure 6:
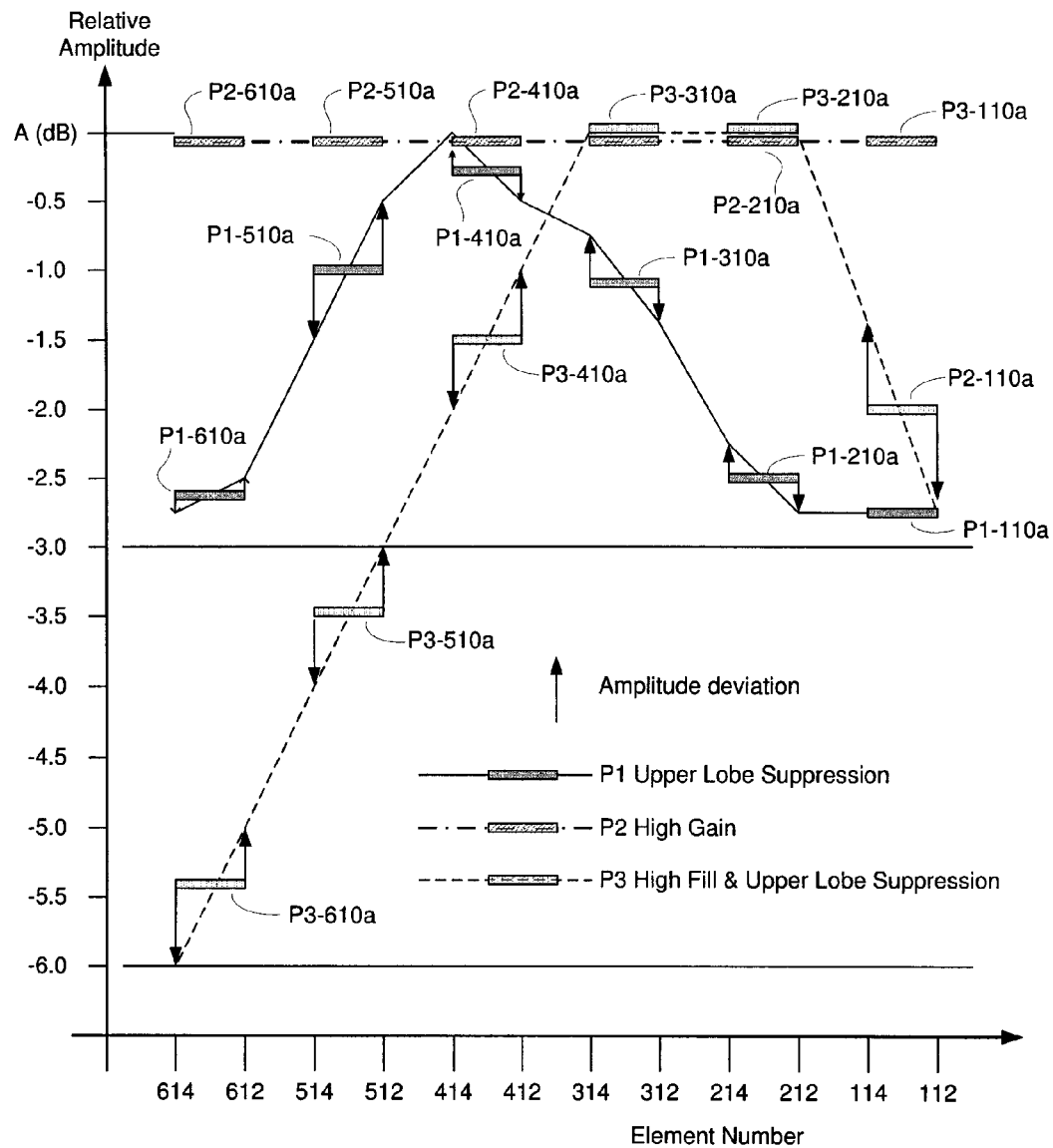
FIG. 6 depicts relative amplitude distribution among the radiating elements of the predistortion compensated antenna array for various radiation patterns in accordance with a preferred embodiment of the present invention.
Figure 7:
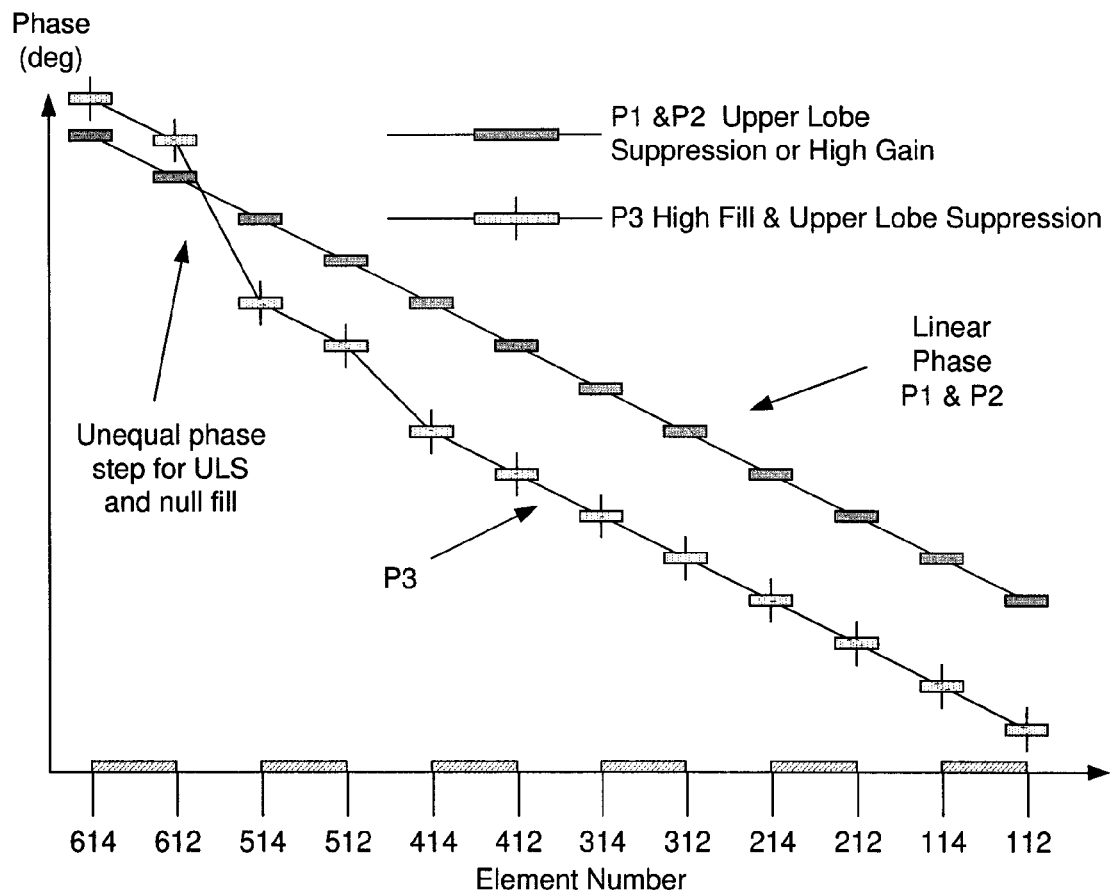
FIG. 7 depicts relative phase distribution among the radiating elements of the predistortion compensated antenna array for various radiation patterns in accordance with a preferred embodiment of the present invention.

FIGS. 6 and 7 present the relative amplitude and phase processing of DL RF signals coupled to each CAM module. FIG. 6 presents the relative RF amplitude signals provided to each radiating elements. Due to use of doublet radiating element construction (112,114), but having a common feed, certain amplitude and phase errors exist in mutually paired radiating elements and between adjacent pairs. In practical terms, this error provides only a minor contribution to overall pattern inaccuracy and for larger element arrays this error is very small.

Figure 10:
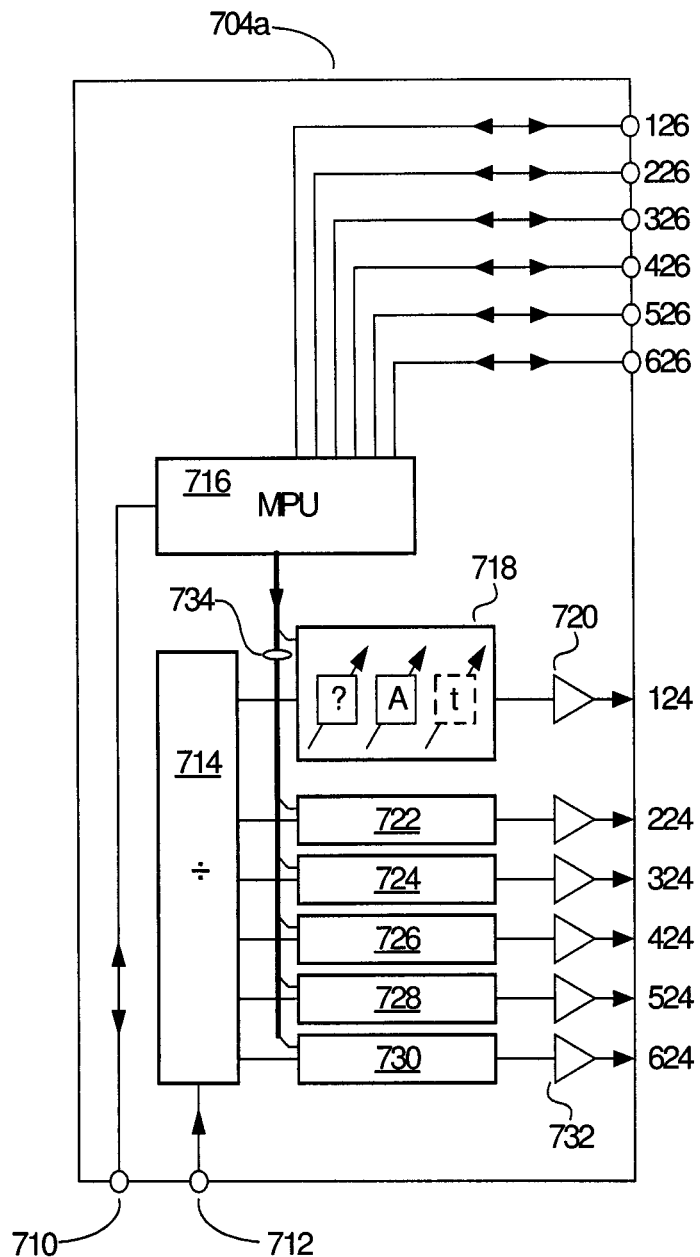
FIG. 10 presents a diagram of an intelligent phase and amplitude dividing TX I/O network and interfacing in accordance with a preferred embodiment of the present invention.

To achieve RF phase and amplitude signal control for each CAM module, an intelligent phase amplitude distribution network (IPA) 704 is presented in FIG. 10. For downlink, RF signals are coupled from Digital Radio (DR) 700 output and coupled through divider 714 that provides equal signal division to each of six phase/amplitude (and optionally delay) adjusting networks (718, 722, 724, 726, 728, 730) that are individually controlled by microprocessor (MPU) 716. There are minor differences, but similarly constructed RX IPA (706) is used to couple UL RF signals received from individual CAM modules back to DR 700 receiver. In some implementations, RX and TX IPA's can use the same MPU, but are shown separately for this discussion. Further, MPU 716 is in communication with DR 700 control logic which instructs MPU 716 the Mode selection. Additional control logic or beam Modes configurations can be incorporated to handle one or more CAM module complete or partial failure, as this will keep antenna operational at somewhat reduced capabilities, until repair and maintenance can be provided. To that effect appropriate module, final assembly weatherization in addition to redundant power supply unit (PSU) 702 can be implemented to improve MTBF of the AAA.

As depicted in FIGS. 4, 9, and 10, MPU 716 is in communication with each controller 138 associated with each CAM module 110, 210, 310, 410, 510, and 610. As shown, each CAM module is equipped with Duplexer 118 which allows Frequency Division Duplex (FDD) operation common in modern cellular networks where the BS is transmitting at one set of frequencies while simultaneously receiving signals transmitted by the MU at a different set of frequencies. It shall be understood that AAA can be easily adapted for Time Division Duplex (TDD) operation by replacing duplexer 118 with a suitable RX-TX change over (transfer) switch and receiver front end isolator to prevent receiver LNA from being damaged by high power transmit signal levels. Unlike FDD which uses two different frequency bands separated by a guard band, TDD operation can be used for data transmissions transmitting a short burst of data in each direction while operating at the same carrier frequencies.

As depicted in FIG. 6, depending on selected beam mode (P1, P2, P3 or alternative mode) transmit power levels from each CAM module can be substantially different. The present invention provides operational advantages by utilizing adaptive predistortion (APD) 136 with each PA stage 140 and 142 used in CAM modules. CAM module controller 138 feeds back operational parameters back to the MPU 716. Since all CAM modules are identical, ease of construction can be readily achieved, but operationally MPU 716 provides expected signal level parameters to each CAM module depending on selected beam mode. For each CAM controller 138, once mode of operation is received, the controller provides optimum predistortion configuration to APD 136 while monitoring input 134 and output 144 detectors. Additionally, controller 138 may alter bias or supply voltage to each amplifier stage 140, 142 as required to meet selected mode (P1, P2, P3, or alternative mode) configuration while providing optimum efficiency and linearity from amplifier stages 140 and 142. Further CAM operational optimization can be achieved since controller 138 can automatically update and store lookup tables based on observed signals for each operational beam mode, and down tilt angle.

FIG. 9 presents a diagram of an exemplary CAM 110. UL signal reception will now be discussed. RF signal reception is achieved by a pair of cross polarized radiators 112 and 114 being coupled to a two way signal splitter/combiner 116. Combined signals, from each element 112, 114, are coupled to ANT port of a duplexer 118. Duplexer 118 provides isolation between TX and RX paths providing individual passage for each RF signal groups (TX or RX). RX signals are coupled to input 160 of the low noise amplifier (LNA) 122. LNA can incorporate any number of circuit designs or configurations. LNA circuit description is omitted. Notwithstanding, amplified 128 RX signals from LNA are coupled to a corresponding RX IPA 706 input ports (128, 228, 328, 428, 528, and 628). RX IPA 706 is similarly configured to TX IPA 704, but the RF signal (UL) flow is in reverse. Active modules 110, 210, 310, 410, 510, and 610 are electrically coupled to RX IPA 706 through ports 130, 230, 330, 430, 530, and 630. Notably, corresponding pairs (TX-RX) phase and amplitude shifters are identically configured to the same settings. The RX signal path mirrors TX path.

Figure 2:
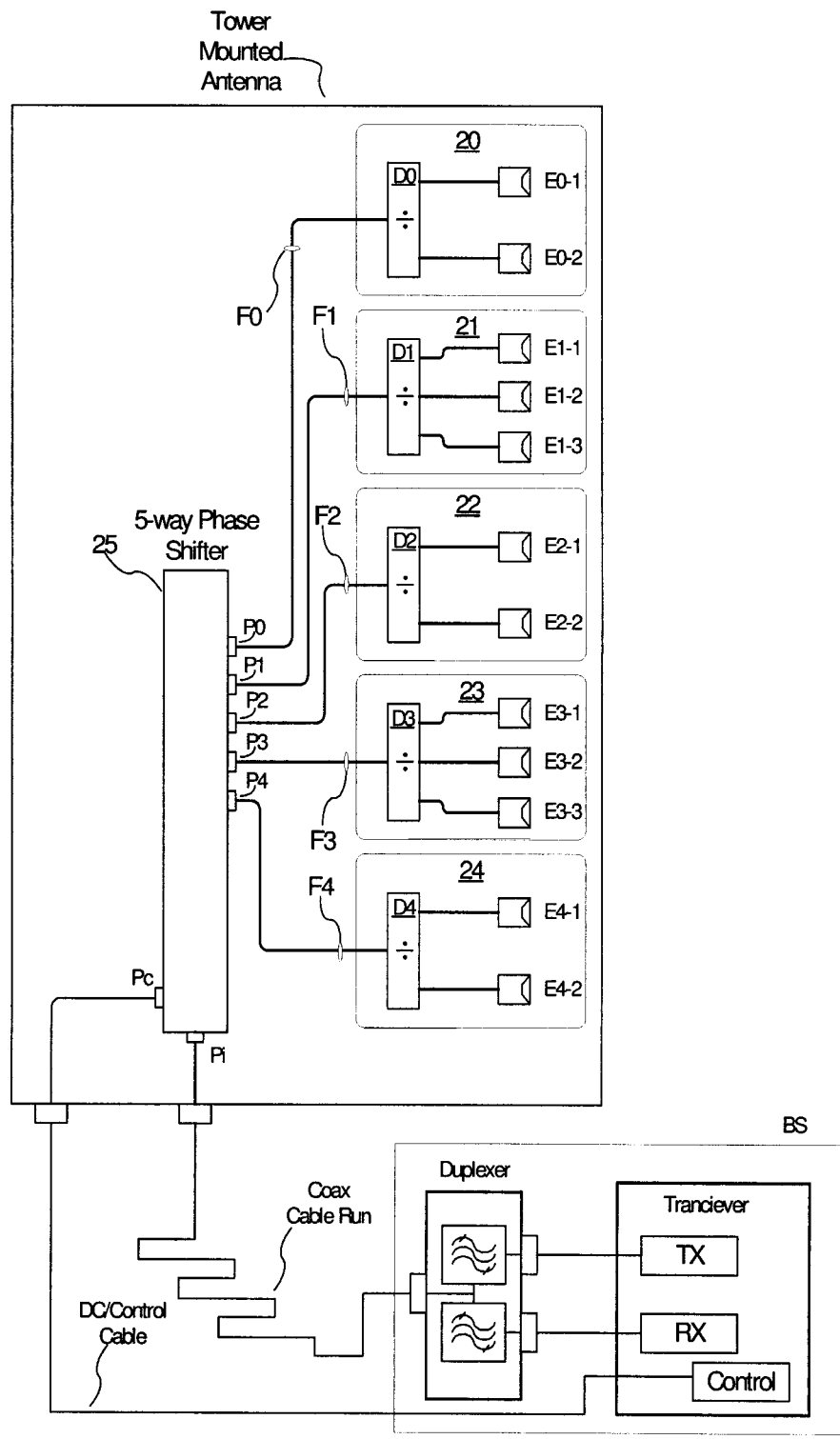
FIG. 2 is a diagram of a conventionally constructed antenna array with beam down tilt capability including interconnections to a Base Station for a remote controlled phase shifter.

As additional background, referring to FIG. 2, a diagram representing an interconnection between a conventionally constructed communication antenna equipped with a remotely controlled electrical phase shifter 25 and a conventional Base Station (BS) is presented. A conventionally constructed communication antenna used for transmitting and receiving cellular communication utilizes a phase shifter 25 which provides required variable signal phase shifts as well as signal division from common RF port Pi to RF I/O ports (P0-P4). Remotely controllable Pc phase shifter 25 is equipped with a common RF port Pi and five distribution RF ports P0 to P4 which are coupled via suitable RF conduits (such as cables, microstrip, and the like) F0 to F4 to radiating sub-modules 20-24. As shown, there are two different radiating sub-module types utilized: three dual 20, 22, 24 and two triple 21, 23 radiating element sub-modules. Differing radiating element groupings allows for convenient signal division and ease of construction, but alternative equal or unequal sub-module construction is also possible. Referring back to radiating sub-modules 20-24, each having fixed, but different ratio RF signal dividers D0-D4 with common port (not explicitly identified) for receiving and transmitting signals via respective RF conduits F0-F4. Each divider D0-D4 network is used to provide the required signal division to individual radiating element (all E0 to E4) to achieve amplitude signal gradient amicable to beam down tilting while maintaining adequate upper side lobe suppression performance.

In a typical Frequency-Division Duplexing (FDD) operation, BS transceiver TX provides RF signals for transmission from BS to MU, which is conventionally called downlink direction, at predetermined frequency while simultaneously MU may communicate (uplink direction) to BS at a different frequency. Frequency-division duplexing means that the transmitter TX and receiver RX operate simultaneously at different carrier frequencies. The two sets of RF signals travel to and from the antenna via coaxial run connecting BS duplexer to antenna RF port Pi. Depending on the installation length of the coaxial cable run can result in signal attenuation substantially effecting performance of such cellular network station. To overcome coaxial cable run losses it is a common practice to use larger, more powerful power amplifiers for transmitters and higher sensitivity receivers—which can be prohibitively expensive and bulky. To minimize effect of signal loss it is highly advantageous to reduce or to eliminate coaxial cable run losses.

The present invention has been described primarily for employing adaptive predistortion with high efficiency power amplifiers to achieve linear signal amplification and beam forming. In this regard, the foregoing description of an adaptive predistortion and high efficiency power amplifiers is presented for purposes of illustration and description. Furthermore, the description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:
1. A predistortion compensated transmitter and antenna system, comprising:
   an input for receiving a digital input communication signal;
   a digital radio receiving the digital input communication signal and providing an RF signal;
   a first amplitude and phase adjusting network receiving the RF signal and providing a first adjusted RF signal;
   a first predistorter receiving the first adjusted RF signal and performing a first predistortion operation on the first adjusted RF signal and providing a first predistorted RF signal;
   a first amplifier having a first amplifier input coupled directly to an output of the first predistorter receiving and amplifying the first predistorted RF signal and providing a first amplified RF signal;
   a first radiating element electrically coupled to receive the first amplified RF signal;
   a second amplitude and phase adjusting network receiving the RF signal and providing a second adjusted RF signal;
   a second predistorter receiving the second adjusted RF signal and performing a second predistortion operation on the second adjusted RF signal and providing a second predistorted RF signal;

a second amplifier having a second amplifier input coupled directly to an output of the second predistorter receiving and amplifying the second predistorted RF signal and providing a second amplified RF signal; and a second radiating element electrically coupled to receive the second amplified RF signal, wherein the first and second radiating elements are positioned in a common column, wherein the digital radio, the first and second amplitude and phase adjusting network, the first and second predistorter, the first and second amplifier, and the first and second radiating element are configured at an antenna radiating location in close proximity with each other.

2. The predistortion compensated transmitter and antenna system as set out in claim 1, wherein said first and second predistorter each performs an analog amplitude and phase predistortion on the respective adjusted RF signal.

3. The predistortion compensated transmitter and antenna system as set out in claim 2, wherein the first and second amplifier each comprise a power amplifier biased for operation in a high efficiency mode.

4. The predistortion compensated transmitter and antenna system as set out in claim 3, wherein the first and second amplifiers are passively cooled.

5. The predistortion compensated transmitter and antenna system as set out in claim 2, further comprising:
a first adaptive controller for providing first amplitude and phase control signals to the first predistorter and a second adaptive controller for providing second amplitude and phase control signals to the second predistorter.

6. The predistortion compensated transmitter and antenna system as set out in claim 5, wherein the first and second radiating element each comprise two cross polarized radiating elements.

7. A predistortion compensated transmitter and antenna system having beam forming capability, comprising:
a divider for receiving an input signal and providing first and second signals;
an amplitude and phase adjusting network controller for providing a first amplitude and phase beam forming control signal and a second amplitude and phase beam forming control signal;
an amplitude and phase adjusting network receiving the first and second amplitude and phase beam forming control signals and the first and second signals, wherein the phase and amplitude of the first and second signals are individually controlled;
a first adaptive predistortion module receiving the first signal and the first amplitude and phase beam forming control signal, performing a predistortion operation on the first signal and providing a first predistorted signal;
a first amplifier amplifying the first predistorted signal and providing a first amplified signal as a first output, wherein the first adaptive predistortion module is in close proximity with the first amplifier;
a first radiating element electrically coupled to the first output;
a second adaptive predistortion module receiving the second signal and the second amplitude and phase beam forming control signal, performing a predistortion operation on the second signal and providing a second predistorted signal;
a second amplifier amplifying the second predistorted signal and providing a second amplified signal as a second output, wherein the second adaptive predistortion module is in close proximity with the second amplifier; and, a second radiating element electrically coupled to the second output, wherein the first and second radiating elements are positioned in a common column.

8. The predistortion compensated transmitter and antenna system as set out in claim 7, wherein the input signal is an analog RF modulated signal and wherein said first adaptive predistortion module performs a first analog amplitude and phase predistortion on the first signal, wherein said second predistortion module performs a second analog amplitude and phase predistortion on the second signal.

9. The predistortion compensated transmitter and antenna system as set out in claim 7, wherein the first adaptive predistortion module, the first amplifier, the first radiating element, the second predistortion module, the second amplifier, and the second radiating element are passively cooled.

10. The predistortion compensated transmitter and antenna system as set out in claim 7, wherein the amplitude and phase adjusting network adjusts the phase and amplitude of the first and second signals in response to a failure in the system.

11. The predistortion compensated transmitter and antenna system as set out in claim 7, further comprising a duplexer coupled between the first amplifier and the first radiating element.

12. A method for adaptively providing an antenna beam of a transmitter and antenna system having a plurality of beam forming modes, said method comprising:
receiving an RF input signal;
providing first and second signals based on the RF input signal, wherein the phase and amplitude of the first and second signals are individually controlled;
receiving a control signal corresponding to a first beam forming mode;
determining a first radiating element expected signal strength for the first signal for the first beam forming mode;
predistorting the first signal based on the first radiating element expected signal strength to form a first predistorted signal;
amplifying the first predistorted signal to form a first output signal;
electrically coupling the first output signal to a first radiating element;
determining a second radiating element expected signal strength for the second signal for the first beam forming mode;
predistorting the second signal based on the second radiating element expected signal strength to form a second predistorted signal;
amplifying the second predistorted signal to form a second output signal;
electrically coupling the second output signal to a second radiating element,
wherein the first and second radiating elements are positioned in a common column; and
generating a first beam pattern from radiated emissions from said first and second radiating elements.

13. The method as set forth in claim 12, further comprising receiving a digital input signal from a remote base station location and converting the digital input signal to RF to provide said RF input signal at the location of said transmitter and antenna system.

14. The method as set forth in claim 12, wherein amplifying the first and second predistorted signal to form the first and second output signals further comprises controlling a first and second amplifier for operation in a high efficiency mode.

15. The method as set forth in claim 12, further comprising:
receiving a control signal corresponding to a second beam forming mode;
determining first and second radiating element expected signal strengths for the first and second signals for the second beam forming mode; and
performing different first and second predistortion operations based on said first and second radiating element expected signal strengths for the first and second signals for the second beam forming mode.

16. The method as set forth in claim 15, further comprising controlling the first and second amplifying by adjusting a first and second amplifier bias based on said first and second radiating element expected signal strengths for the first and second signals for the second beam forming mode.

17. The method as set forth in claim 12, further comprising determining the relative phase value and relative amplitude value for the first beam forming mode, and wherein determining the first and second radiating element expected signal strength for the first and second signals for the first beam forming mode employs said relative phase value and relative amplitude value for the first beam forming mode.

18. The method as set forth in claim 17, wherein determining the relative phase value and relative amplitude value further comprises determining the relative phase value and relative amplitude value that tilts the first beam pattern to a predetermined direction.

19. The method as set forth in claim 17, wherein determining the relative phase value and relative amplitude further comprises determining the relative phase value and relative amplitude value that minimizes the upper side lobe of the first beam pattern.

20. The method as set forth in claim 17, wherein determining the relative phase value and relative amplitude further comprises determining the relative phase value and relative amplitude value that maximizes the gain of the main emission lobe of the first beam pattern.

21. The method as set forth in claim 17, wherein determining the relative phase value and relative amplitude further comprises determining the relative phase value and relative amplitude value that provides inter lobe null filling of the first beam pattern.

* * * * *